(12) United States Patent
Satoh et al.

(10) Patent No.: US 8,450,766 B2
(45) Date of Patent: May 28, 2013

(54) LIGHT EMITTING DEVICE

(75) Inventors: Eiichi Satoh, Osaka (JP); Takayuki Shimamura, Osaka (JP); Reiko Taniguchi, Osaka (JP); Shogo Nasu, Hyogo (JP); Masayuki Ono, Osaka (JP); Masaru Odagiri, Hyogo (JP)

(73) Assignee: Panasonic Corporation, Osaka (JP)

( * ) Notice: Subject to any disclaimer, the term of this patent is extended or adjusted under 35 U.S.C. 154(b) by 372 days.

(21) Appl. No.: 12/922,726

(22) PCT Filed: Mar. 16, 2009

(86) PCT No.: PCT/JP2009/001155
§ 371 (c)(1),
(2), (4) Date: Sep. 15, 2010

(87) PCT Pub. No.: WO2009/116259
PCT Pub. Date: Sep. 24, 2009

(65) Prior Publication Data
US 2011/0006296 A1    Jan. 13, 2011

(30) Foreign Application Priority Data
Mar. 17, 2008    (JP) .................................. 2008-067504

(51) Int. Cl.
*H01L 33/00*    (2010.01)
(52) U.S. Cl.
USPC .......................................... 257/99; 313/503
(58) Field of Classification Search
USPC .......................................... 257/99; 313/503
See application file for complete search history.

(56) References Cited

U.S. PATENT DOCUMENTS

| 5,912,533 | A | 6/1999 | Lee et al. |
| 6,838,816 | B2 | 1/2005 | Su et al. |
| 2006/0152138 | A1 | 7/2006 | Hori et al. |

FOREIGN PATENT DOCUMENTS

| JP | 6-158038 | 6/1994 |
| JP | 8-250764 | 9/1996 |
| JP | 8-306485 | 11/1996 |
| JP | 10-69979 | 3/1998 |
| JP | 11-162640 | 6/1999 |
| JP | 2001-210865 | 8/2001 |
| JP | 2002-35906 | 2/2002 |
| JP | 2002-40678 | 2/2002 |
| JP | 2002-75253 | 3/2002 |
| JP | 2002-523610 | 7/2002 |
| JP | 2003-123967 | 4/2003 |
| JP | 2004-47121 | 2/2004 |
| JP | 2006-120328 | 5/2006 |
| JP | 2007-63301 | 3/2007 |
| WO | WO 00/12649 | 3/2000 |
| WO | WO 2005/004545 | 1/2005 |
| WO | WO 2008/023620 | 2/2008 |

*Primary Examiner* — Anthony Ho
(74) *Attorney, Agent, or Firm* — Hamre, Schumann, Mueller & Larson, P.C.

(57) ABSTRACT

A light emitting device (10) of the present invention includes: a back electrode (2) as a first electrode and a transparent electrode (3) as a second electrode facing each other, at least one of the back electrode and the transparent electrode having transparency to light; and luminescent particles (4) provided between the back electrode (2) and the transparent electrode (3) and connected electrically to the back electrode (2) and the transparent electrode (3). The back electrode (2) as the first electrode has recesses in a surface thereof facing the transparent electrode (3).

13 Claims, 7 Drawing Sheets

LIGHT EMITTING DEVICE

TECHNICAL FIELD

The present invention relates to a light emitting device including luminescent particles.

BACKGROUND ART

In recent years, electroluminescent devices (hereinafter referred to as EL devices) have received attention as lightweight and thin light emitting devices of the surface-emitting type. The EL devices roughly are categorized into organic EL devices and inorganic EL devices. In the organic EL devices, a direct current voltage is applied to a luminescent material made of organic material, and electrons and holes are recombined to emit light. In the inorganic EL devices, an alternating current voltage is applied to a luminescent material made of inorganic material, electrons accelerated in an electric field as high as $10^6$ V/cm are made to collide with a luminescence center of the inorganic luminescent material to excite the inorganic luminescent material, and the inorganic luminescent material emits light during a process of relaxing the excitation.

The inorganic EL devices are categorized into: dispersion-type EL devices (see JP 2006-120328 A) including a light-emitting layer formed by dispersing inorganic luminescent particles in a binder made of polymer organic material; and thin-film-type EL devices including a thin light-emitting layer with a thickness of approximately 1 μm obtained by thinning an inorganic luminescent material, with an insulating layer being provided on one or both sides of this thin light-emitting layer.

Among these, the dispersion-type EL devices have been gaining attention because they consume less power, and they are easy to produce, which is an advantage in reducing production cost.

However, an alternating current voltage is used for the conventional inorganic EL devices, and a high alternating current voltage is required to drive them. Thus, to be used in high-definition display apparatuses, the conventional inorganic EL devices have many problems in that, for example, they are incapable of active-matrix driving and have insufficient brightness and efficiency.

Figure 7:
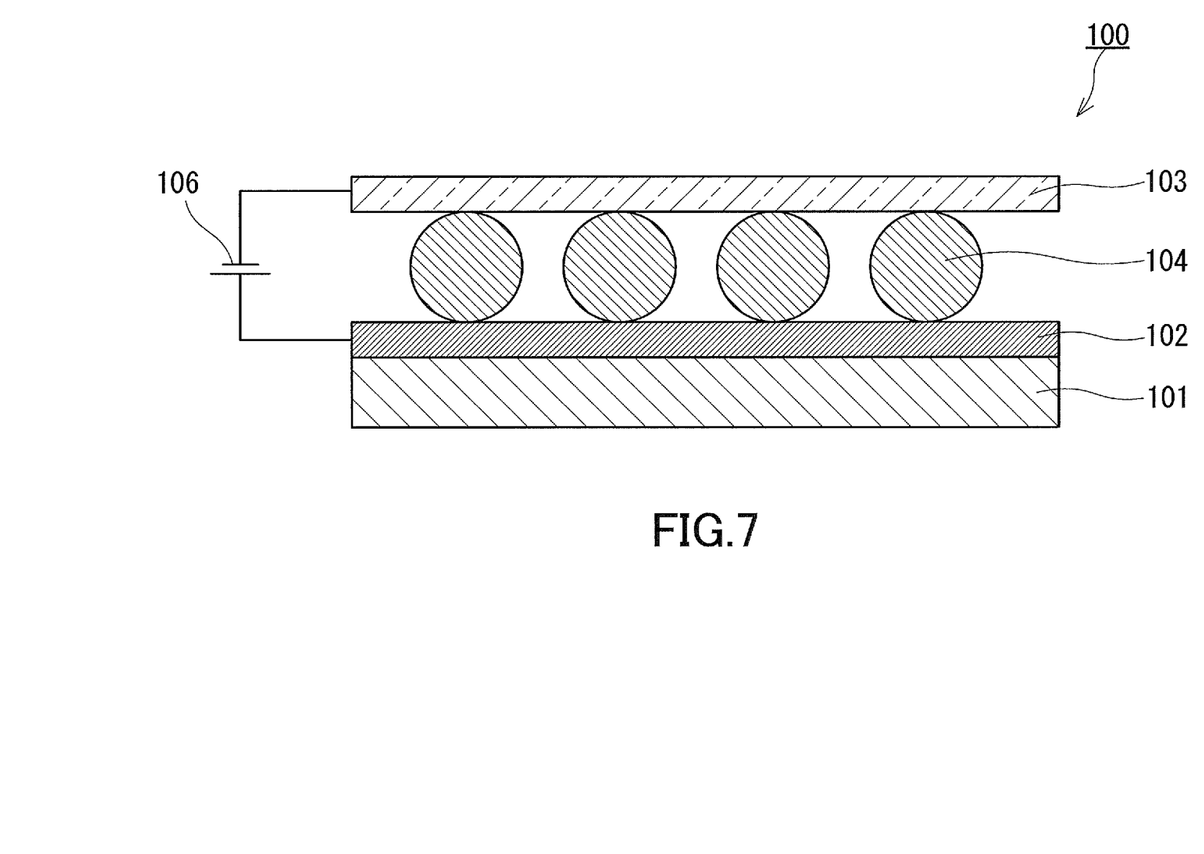
FIG. 7 is a cross-sectional view showing a schematic configuration of a conventional light emitting device.

In view of the foregoing, the present inventors have invented a light emitting device that emits light by applying a direct current voltage to luminescent particles made of inorganic material and recombining electrons with holes in the luminescent particles. FIG. 7 is a cross-sectional view of a light emitting device 100. The light emitting device 100 shown in FIG. 7 includes a back electrode 102 and a transparent electrode 103 facing each other, luminescent particles 104 sandwiched between the back electrode 102 and the transparent electrode 103, and a substrate 101 for supporting the back electrode 102. A direct current power supply 106 is connected electrically to the light emitting device 100 to apply a direct current voltage thereto. In this configuration, however, electrically-connected portions between the electrode 102 and the luminescent particles 104 and between the electrode 103 and the luminescent particles 104 are few, causing a problem in that it is difficult to supply a sufficient amount of carriers to the luminescent particles 104. As a result, sufficient brightness cannot be obtained.

DISCLOSURE OF THE INVENTION

The present invention has been accomplished to solve the above-mentioned problems. The present invention is intended to provide a light emitting device with high brightness by supplying carriers to luminescent particles efficiently.

The above-mentioned object is achieved by the light emitting device described below.

The light emitting device of the present invention includes: a first electrode and a second electrode facing each other, at least one of the first electrode and the second electrode having transparency to light; and luminescent particles provided between the first electrode and the second electrode and connected electrically to the first electrode and the second electrode. The first electrode has recesses in a surface thereof facing the second electrode.

In the light emitting device, the first electrode thus formed makes it possible to supply carriers to the luminescent particles efficiently. Thereby, the light emitting device with high brightness can be provided.

BEST MODE FOR CARRYING OUT THE INVENTION

Hereinafter, embodiments of the present invention will be described with reference to the drawings. In the following description, the same parts are indicated with the same reference numerals and repetitive description thereof may be omitted.

(Embodiment 1)

1 Brief Configuration of a Light Emitting Device According to Embodiment 1

Figure 1:
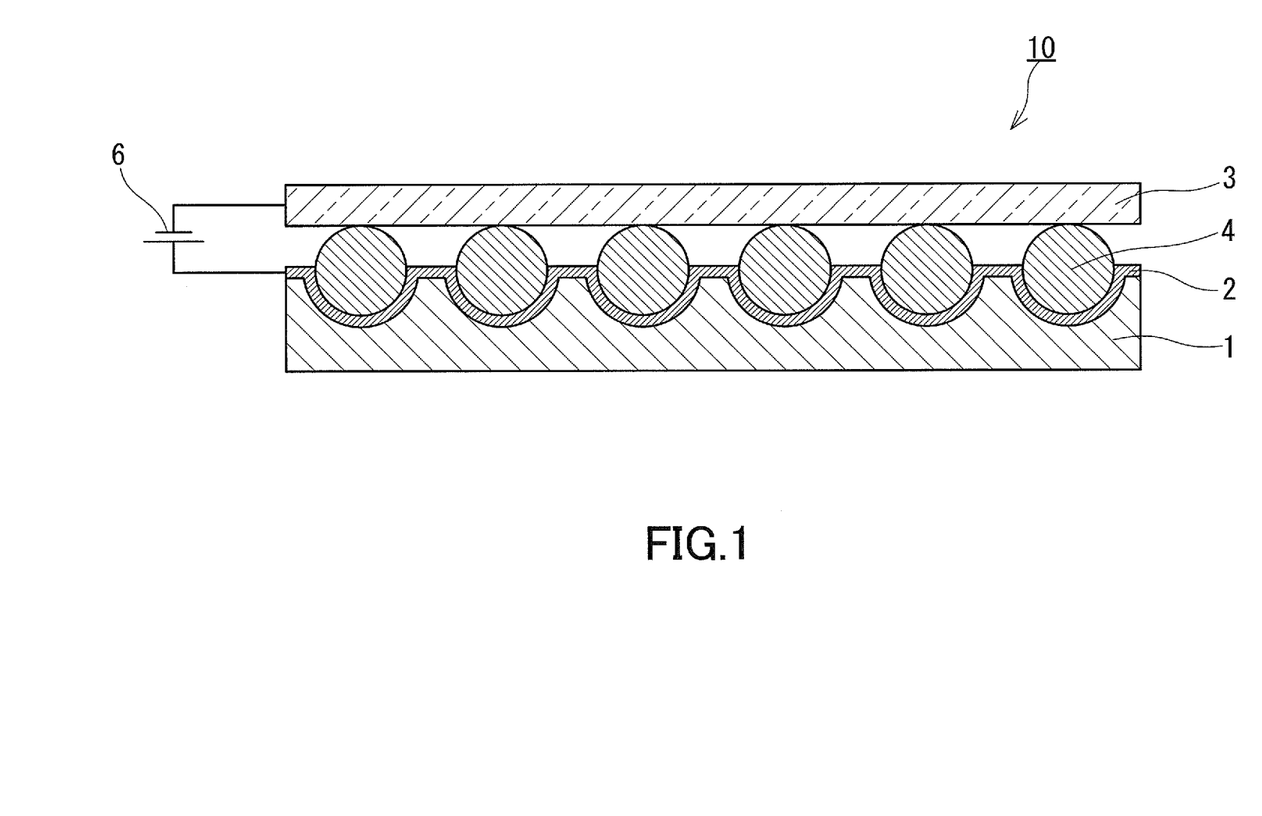
FIG. 1 is a cross-sectional view showing a schematic configuration of a light emitting device according to Embodiment 1.

An embodiment of a light emitting device according to the present invention will be described. FIG. 1 is a cross-sectional view showing a schematic configuration of a light emitting device 10 according to the present embodiment 1. The light emitting device 10 includes a back electrode (first electrode) 2 and a transparent electrode (second electrode) 3 facing each other, and luminescent particles 4 provided between the back electrode 2 and the transparent electrode 3 and connected electrically to the back electrode 2 and the transparent electrode 3. The back electrode 2 has recesses in a surface thereof facing the transparent electrode 3. The light emitting device 10 further includes a substrate (supporting substrate) 1 for supporting the back electrode 2, the luminescent particles 4, and the transparent electrode 3. The substrate 1 is in contact with the back electrode 2 and has, on a back electrode 2 side, a surface in which recesses are formed. The back electrode 2 is provided along the surface of the substrate 1 having the recesses. The back electrode 2 has a substantially uniform thickness. A direct current power supply 6 serves to apply a direct current voltage to the light emitting device 10. The back electrode 2 is connected electrically to the positive electrode of the direct current power supply 6. The transparent electrode 3 is connected electrically to the negative electrode of the direct current power supply 6. Here, the expression "the back electrode 2 has a substantially uniform thickness" means that a difference between a maximum thickness and a minimum thickness of the back electrode 2 is 500 nm or less, preferably 50 nm or less.

The luminescent particles 4 are disposed in the recesses of the back electrode 2 and connected electrically to the back electrode 2. More specifically, the luminescent particles 4 are disposed in such a matter that the luminescent particles 4 are fitted in the recesses of the back electrode 2, and the luminescent particles 4 are in contact with the back electrode 2 at inner surfaces of the recesses. The recesses of the back electrode 2 are formed in an arc shape similar to the cross-sectional shape of the luminescent particles 4. Therefore, a surface of the respective luminescent particles 4 on a back electrode side is in contact with almost the entire inner surface of the respective recesses formed in the back electrode 2. However, the respective luminescent particles 4 do not necessarily have to be in contact with the entire inner surface of the respective recesses formed in the back electrode 2 because it is not easy to equalize perfectly the particle diameters of the luminescent particles 4 with each other or to equalize perfectly the shape of the recesses of the back electrode with the shape of the luminescent particles 4.

The transparent electrode 3 is disposed so as to face the back electrode 2, with the luminescent particles 4 interposed therebetween. The transparent electrode 3 is in direct contact with the luminescent particles 4. Here, when the respective luminescent particles 4 have a smaller particle diameter than a depth of the respective recesses formed in the back electrode 2, the luminescent particles 4 are completely inside the recesses. When the luminescent particles 4 are completely inside the recesses of the back electrode 2, it becomes difficult for the transparent electrode 3 to be in direct contact with the luminescent particles 4. Therefore, it is preferable that an average particle diameter of the luminescent particles 4 is larger than the depth of the respective recesses formed in the back electrode 2. Here, a particle diameter of the respective luminescent particles 4 is a diameter equivalent to a light-scattering diameter measured using a laser diffraction/scattering method. The average particle diameter is an average value obtained from the entire frequency distribution of the particle diameters resulted from the above-mentioned measurement on the luminescent particles 4. The average particle diameter is the diameter at the highest frequency among peak values in the frequency distribution of the particle diameters.

When power is supplied from the direct current power supply 6 to the light emitting device 10, holes are supplied to the luminescent particles 4 from the back electrode 2 connected to the positive electrode, and electrons are supplied to the luminescent particles 4 from the transparent electrode 3 connected to the negative electrode. The electrons and holes supplied to the luminescent particles 4 are recombined in the luminescent particles 4. This recombination allows the luminescent particles 4 to emit light. The light emitted from the luminescent particles 4 exits the light emitting device 10 through the transparent electrode 3.

The "hole" is a position in crystals of semiconductors and insulating materials that lacks a valence electron. The hole behaves like a particle with a positive charge and takes a major role in the electric conduction. The "supply of the holes to the luminescent particles" in this description means that the holes are transferred relatively from the positive electrode into the luminescent particles when the valence electrons are transferred.

In the light emitting device 10 according to the present embodiment 1, the luminescent particles 4 are disposed in such a matter that they are fitted in the recesses of the back electrode 2. Such a configuration increases contact areas between the luminescent particles 4 and the back electrode 2 and thus increases the electrically-connected portions between the back electrode 2 and the luminescent particles 4. This enhances the efficiency in supplying the holes from the back electrode 2 to the luminescent particles. Since a sufficient amount of holes are supplied to the luminescent particles 4, the probability of recombination between the electrons and the holes in the luminescent particles 4 is increased. As a result, the brightness of the luminescent particles 4 is increased.

Next, respective components constituting the light emitting device will be described in detail.

1.1 Substrate

The substrate 1 supports each of the components formed thereon. As the substrate 1, there can be used, for example, a ceramic substrate made of a material such as silicon, $Al_2O_3$, and AlN, and a plastic substrate made of a material such as polyester and polyimide. When the light exits from a substrate 1 side, the substrate 1 is required to be made of a material having transparency to the wavelength of the light emitted from the luminescent particles 4. Examples of such a material include glass such as "Corning 1737" produced by Corning, Inc., and quartz. In order to prevent alkaline ions, etc. contained in ordinary glass from affecting the light emitting device, the material for the substrate 1 may be alkali-free glass or soda lime glass whose surface is coated with alumina, etc. as an ion barrier layer.

In Embodiment 1, the substrate 1 has the surface in which the recesses are formed. When the recesses are formed in the substrate 1 in advance, the back electrode 2 can be formed along this surface with the recesses, making it easy to form the recesses in the back electrode 2.

1.2 Electrodes

As electrodes, the back electrode 2 and the transparent electrode 3 are used. The transparent electrode 3 is used as the electrode through which the light exits, and the back electrode 2 is used as the other.

The material for the transparent electrode 3 through which the light exits is not particularly limited as long as it has transparency to the wavelength of the light emitted from the luminescent particles 4. Preferably, the material has low resistivity. Preferable examples of the material for the transparent electrode include: metal oxides such as ITO ($In_2O_3$ doped with $SnO_2$, also referred to as indium tin oxide), ZnO, AlZnO, and GaZnO; and conductive polymers such as polyaniline, polypyrrole, PEDOT/PSS (Poly(3,4-ethylenedioxythiophene)/Poly(styrene sulfonate)), and polythiophene. However, the material for the transparent electrode is not limited to these.

An ITO film can be formed using a film forming method such as sputtering, electron beam evaporation, and ion plating in order to improve its transparency or reduce its resistivity. Moreover, the formed film may be subjected to a surface treatment, such as a plasma treatment, in order to control the resistivity. The thickness of the transparent electrode 3 is determined based on required values of sheet resistance and visible light transmittance.

The back electrode 2 through which no light exits can be formed of any common conductive material. For example, it is possible to use a material obtained by stacking one or more thin metal films formed of, for example, Au, Ag, Al, Cu, Ta, Ti, and Pt.

The back electrode 2 and the transparent electrode 3 each may be configured so as to cover the entire surface inside the layer. Or the back electrode 2 and the transparent electrode 3 each may be configured by arranging a plurality of electrodes in a stripe pattern.

Furthermore, there may be used a configuration in which the back electrodes 2 formed in a stripe pattern are in a skewed relationship to the transparent electrodes 3 formed in a stripe pattern, and the projection of the respective stripe-pattern transparent electrodes 3 on a light-emitting surface (a surface parallel to a layer of the luminescent particles 4) cross with the projection of the respective stripe-pattern back electrodes 2 on the light-emitting surface. In this case, it is possible to constitute a display in which light is emitted from a specified point (specified pixel) when a voltage is applied to an electrode selected from the stripe-pattern back electrodes 2 and an electrode selected from the stripe-pattern transparent electrodes 3.

1.2.1 Recesses

In Embodiment 1, in order to increase the electrically-connected portions between the luminescent particles 4 and the back electrode 2, the back electrode 2 has the recesses in the surface facing the transparent electrode 3. In Embodiment 1, the surface with the recesses is provided to the substrate 1 in advance. The recesses are formed in the back electrode 2 by forming the back electrode 2 with the substantially uniform thickness along the surface of the substrate 1 having the recesses. The substrate 1 does not need to be provided with the recesses. In this case, the recesses may be formed in the surface of the back electrode 2 facing the transparent electrode 3.

Figure 2A:
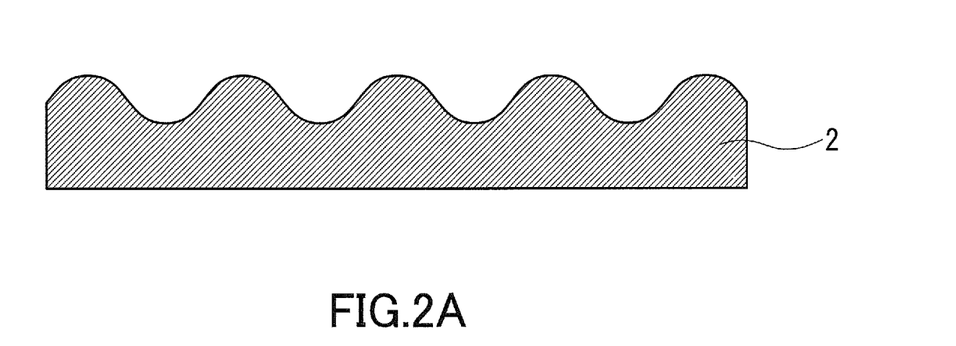
FIG. 2A and FIG. 2B each are a cross-sectional view showing a schematic example of the shape of recesses formed in the light emitting device according to Embodiment 1.
Figure 2B:
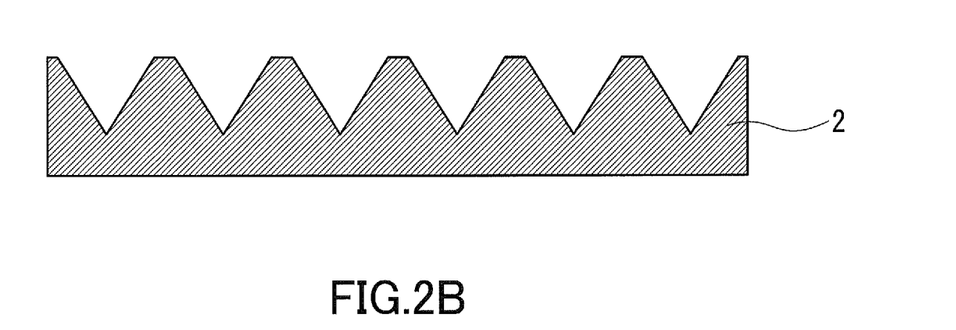

The cross-sectional shape of the recesses formed in the back electrode 2 can be changed to a shape such as a wave shape as shown in FIG. 2A and a triangle shape as shown in FIG. 2B other than an arc shape as shown in FIG. 1. It may be a shape other than these shapes, of course. Although not shown, a polygonal shape other than the triangle shape may be used.

When the recesses have the wave cross-sectional shape, the luminescent particles 4 can be in surface contact with the back electrode 2 because the cross-sectional shape is relatively similar to the particle shape of the luminescent particles. Accordingly, the electrically-connected portions between the luminescent particles 4 and the back electrode 2 are increased.

When the recesses have the triangle cross-sectional shape or the polygonal cross-sectional shape, the respective luminescent particles 4 are in contact with the back electrode 2 at at least two or more points, increasing the electrically-connected portions therebetween. The recesses having the polygonal cross-sectional shape are preferable because the electrically-connected portions are increased more in this case.

In order to ensure more electrically-connected portions between the luminescent particles 4 and the back electrodes 2, the shape of the recesses preferably is an arc shape similar to the particle shape of the luminescent particles. Such a configuration allows the back surface of the respective luminescent particles 4 to be in contact with almost the entire inner surface of the respective recesses formed in the back electrode 2.

Figure 3A:
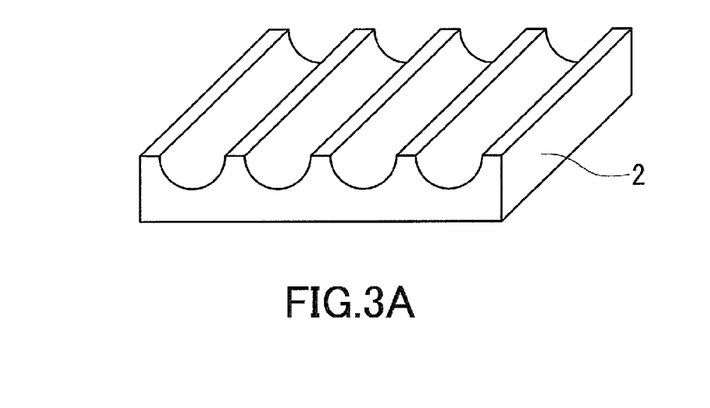
FIG. 3A to FIG. 3D each are a perspective view showing an example of the shape of the recesses formed in the light emitting device according to Embodiment 1.
Figure 3B:
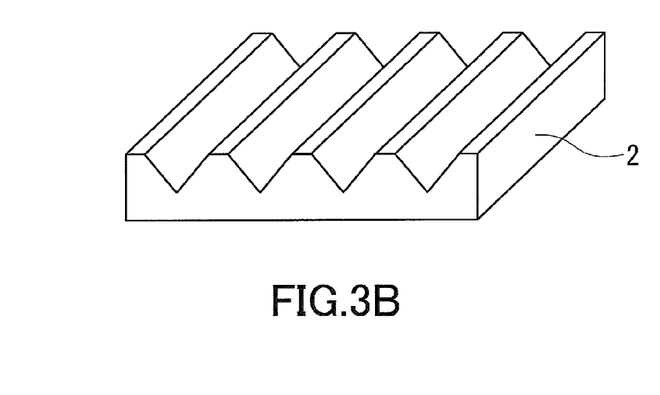
Figure 3C:
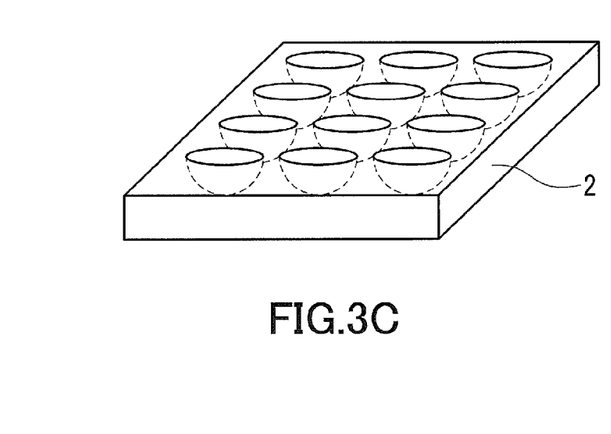
Figure 3D:
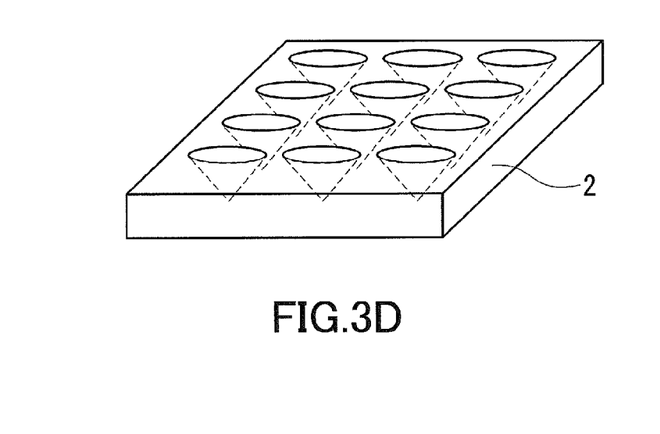

The recesses of the back electrode 2 may have a groove shape as shown in FIG. 3A or FIG. 3B. Alternatively, the recesses of the back electrode 2 may be a plurality of bowl-shape recesses formed as shown in FIG. 3C, or may be a plurality of conical recesses formed as shown in FIG. 3D. The groove-shape recesses may be arranged in a stripe pattern in which a plurality of the groove-shape recesses are formed in parallel with each other toward one direction, or may be arranged in a grid pattern in which a plurality of the groove-shape recesses are formed so as to intersect perpendicularly with each other. These configurations allow the luminescent particles 4 to be disposed uniformly on the back electrode 2. Alternatively, it is possible to form the recesses in the back electrode 2 by using both the groove-shape recesses and the bowl-shape recesses. In this way, by using the groove-shape recesses and the bowl-shape recesses in various combinations, it also is possible to control the pattern in which the luminescent particles 4 are arranged. Such a configuration makes it possible to represent arbitrary characters and marks easily.

Figure 6A:
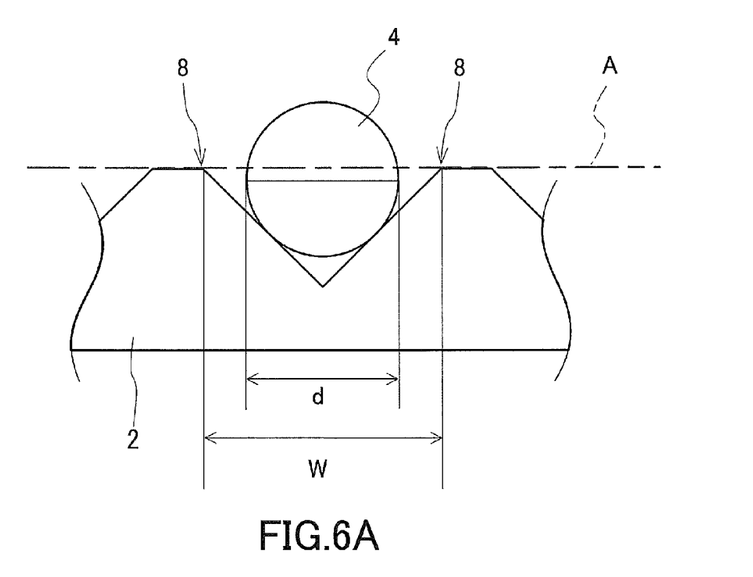
FIG. 6A is a diagram illustrating a relationship between a size of a luminescent particle and a size of a recess.
Figure 6B:
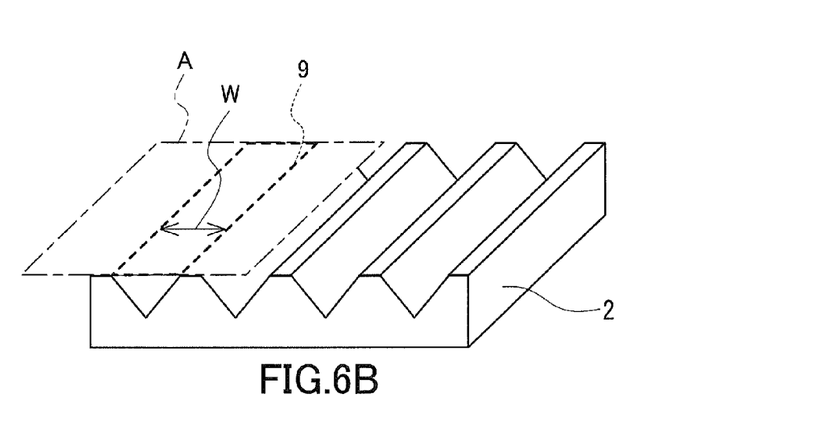
FIG. 6B is a diagram illustrating a width of a recess when the recess has a groove shape shown in FIG. 3B.
Figure 6C:
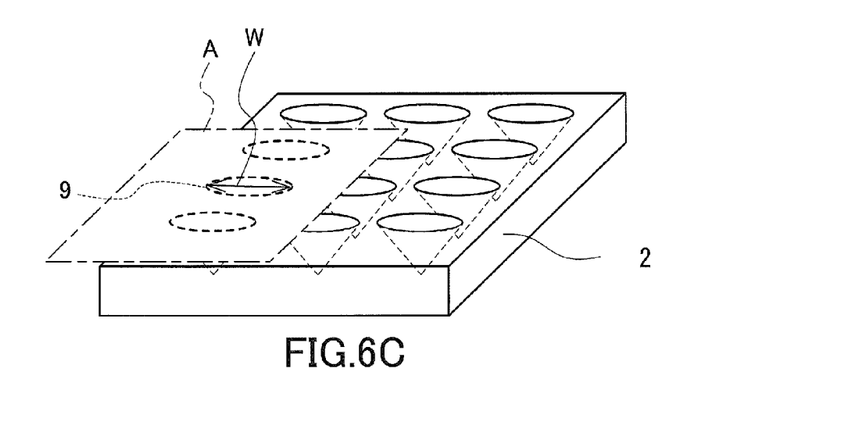
FIG. 6C is a diagram illustrating a width of a recess when the recess has a conical shape shown in FIG. 3D.

A width, depth, etc. of the respective recesses formed in the back electrode 2 can be changed appropriately in accordance with the size of the luminescent particles. When the depth of the respective recesses is excessively larger than the average particle diameter of the luminescent particles 4, the luminescent particles 4 are completely inside the recesses of the back electrode 4, making it difficult for the transparent electrode 3 to be in contact with the luminescent particles 4. Thus, it is preferable that the depth of the respective recesses is smaller than the average particle diameter of the luminescent particles 4. More specifically, it is preferable that a depth D of the respective recesses and an average particle diameter d of the luminescent particles 4 satisfy a relationship of D<d. Moreover, the width of the respective recesses may be larger than the average particle diameter of the luminescent particles 4 so that the luminescent particles 4 are in contact with the back electrode 2 more surely at the inner surfaces of the recesses. More specifically, a width W of the respective recesses and the average particle diameter d of the luminescent particles may satisfy a relationship of W>d. As shown in FIG. 6A, the width W of the respective recesses is a maximum diameter (when the recesses have a bowl shape) or a maximum width (when the recesses have a groove shape) of an opening 9 of the respective recesses (see FIG. 6B and FIG. 6C) formed by a contact between a reference plane A and an edge 8 of the respective recesses when a plane contacting the edge 8 is defined as the reference plane A. For example, when the respective recesses have the groove shape shown in FIG. 3B, the width of the respective recesses is as shown in FIG. 6B. For another example, when the respective recesses have the conical shape (bowl shape) shown in FIG. 3D, the width of the respective recesses is as shown in FIG. 6C. The depth D of the respective recesses is a maximum depth of the respective recesses measured from the reference plane A.

When the respective recesses of the back electrode 2 have a groove shape, it is more preferable that a plurality of the luminescent particles 4 are disposed in a row in the respective groove-shape recesses. When the respective recesses of the back electrode 2 have a bowl shape, it is more preferable that one luminescent particle 4 is disposed in one recess. Such a configuration makes it possible to increase the electrically-connected portions between each of the luminescent particles 4 and the back electrode 2.

As the method for forming the recesses of the back electrode 2, a sandblasting method and an reactive ion etching method can be mentioned, for example. Hereinafter, the method for forming the recesses will be described in further detail.

When the sandblasting method is used, a glass substrate is used, for example, and a coating-type glass paste is applied to the glass substrate to form a resist pattern. Subsequently, the applied glass paste is etched by the sandblasting method. Thus, the recesses are formed. As the coating-type glass paste, a material easy to be etched by sandblasting is selected. Thereby, it is possible to etch only the applied coating-type glass paste. Moreover, it is possible to control the depth of the recess by changing the thickness of the applied glass paste. Also, it is possible to control the shape and dimensions of the recess by changing the resist pattern.

The above-mentioned method makes it possible to form the recesses with the shape as shown in FIG. 3C.

When the reactive ion etching method is used, a glass substrate is used, for example, and a resist pattern is formed on the glass substrate, for example. The glass substrate is etched by reactive ion etching using the resist pattern formed on the glass substrate. As an etching gas, a gas containing fluorine such as $CF_4$ and $CHF_3$ is used, and an inert gas such as Ar also is added thereinto to obtain a desired shape.

The above-mentioned method makes it possible to form the recesses with the shape as shown in FIG. 3C. The depth of the etched portion can be adjusted by the time for which the etching is performed.

When the wet etching method is used, a substrate made of single crystal silicon is used, for example, and a mask pattern made of, for example, silicon oxide is formed on the single crystal silicon substrate. Subsequently, the silicon oxide is etched using potassium hydroxide as an etching solution. Use of potassium hydroxide allows the etching to proceed in accordance with the crystal orientation, making it possible to form the recesses with the cross-sectional shape as shown in FIG. 2B. The depth of the recesses can be controlled by the time for which the wet etching is performed. When a glass substrate is used as the substrate, a resist pattern is used as the mask pattern, and the pattern is formed using fluoric acid as the etching solution, it is possible to form the recesses with the cross-sectional shape as shown in FIG. 2A.

1.3 Luminescent Particles

AlN, GaN, InN, AlP, GaP, InP, AlAs, GaAs, AlSb, etc., which are group 13-15 compound semiconductors, can be used for the luminescent particles 4. Particularly, group 13 nitride semiconductors typified by GaN are preferable. Also, a mixed crystal thereof (GaInN, for example) may be used. Furthermore, the luminescent particles 4 may contain one or a plurality of elements selected from the group consisting of Si, Ge, Sn, C, Be, Zn, Mg, Ge, and Mn as a dopant in order to control the conductivity.

Moreover, the luminescent particles 4 may be formed of a material containing, as a base material, nitride such as InGaN and AlGaN, ZnSe, ZnS, GaP, CdSe, CdTe, SrS, CaS, and ZnO. The luminescent particles 4 may be formed of a material composed only of such a base material, or may be formed of a material obtained by adding at least one element selected from Ag, Al, Ga, Cu, Mn, Cl, Tb, and Li into the base material as an additive. Moreover, a multi-element compound such as ZnSSe, and a thiogallate phosphor also can be used.

Furthermore, the above-mentioned compositions may compose a layered structure or segregation structure in the luminescent particles 4.

(Embodiment 2)

2 Brief Configuration of a Light Emitting Device According to Embodiment 2

Figure 4:
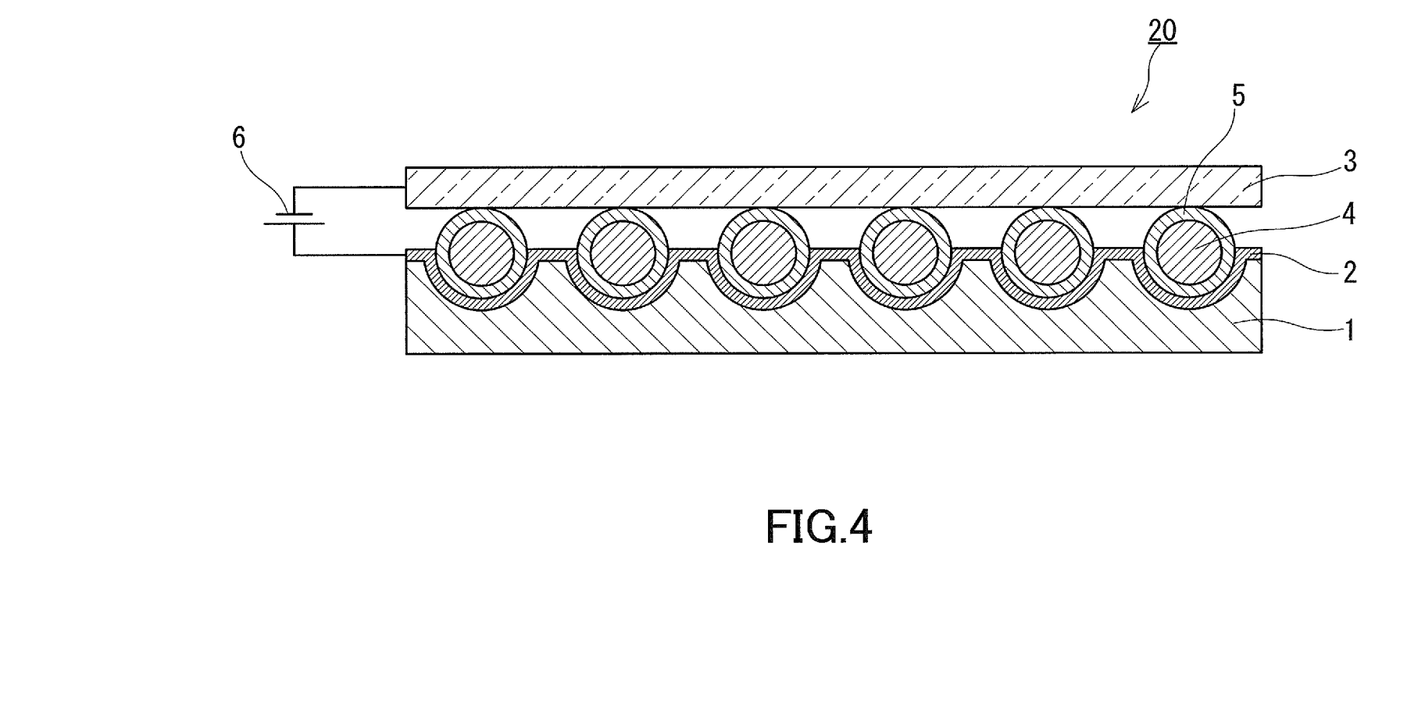
FIG. 4 is a cross-sectional view showing a schematic configuration of a light emitting device according to Embodiment 2.

A light emitting device according to Embodiment 2 will be described with reference to FIG. 4. FIG. 4 is a cross-sectional view showing a schematic configuration of a light emitting device 20 according to Embodiment 2. The light emitting device 20 is different from the light emitting device 10 shown in FIG. 1 in that a surface of each of the luminescent particles 4 is coated with a hole transport material (carrier transport material) 5. Since other configurations are the same as those of Embodiment 1, descriptions thereof are omitted.

A description will be made to explain how the carriers are supplied to the luminescent particles 4 whose surfaces are coated with the hole transport material 5. The holes are supplied to the luminescent particles 4 from the back electrode 2 connected to the positive electrode of the direct current power supply 6 via the hole transport material 5. In contrast, the electrons are supplied to the luminescent particles 4, crossing a barrier between the back electrode 2 and the hole transport material 5. Conceivably, this is because the luminescent particles 4 used in the present invention have a higher electron affinity than those of organic luminescent materials commonly used for organic EL, and thereby the barrier becomes relatively small. Furthermore, it is conceivable that the electrons are supplied partly by tunneling because a film of the hole transport material 5 with which the surfaces of the luminescent particles 4 are coated has a small thickness (5 nm to 200 nm, for example), and a high electric field strength is applied to this film that is formed of the hole transport material 5 having a higher resistivity than that of the luminescent particles 4.

In the light emitting device 20 according to Embodiment 2, the back electrode 2 for supplying the holes has recesses. The luminescent particles 4 whose surfaces are coated with the hole transport material 5 are disposed in these recesses so as to be in contact with the back electrode 2. More specifically, the luminescent particles 4 whose surfaces are coated with the hole transport material 5 are disposed in such a matter that they are fitted in the recesses of the back electrode 2, and are connected electrically to the back electrode 2. Many of the holes serving as carriers reach the luminescent particles 4 through a low-resistance path in the hole transport material 5, that is, the shortest path from the back electrode 2 to the luminescent particles 4. More specifically, use of such a configuration as in Embodiment 2 allows a plurality of the low-resistance paths to exist.

Accordingly, the efficiency in supplying the holes to the luminescent particles 4 can be enhanced, increasing the probability of recombination between the electrons and the holes in the luminescent particles 4. As a result, the brightness of the luminescent particles 4 is increased.

It is difficult to supply carriers, particularly holes, to nitride semiconductor particles typified by GaN. Thus, the above-mentioned configuration is particularly effective when such nitride semiconductor particles typified by GaN are used as the luminescent particles 4.

2.1 Hole Transport Material

Next, the hole transport material 5 will be described. An organic hole transport material is used in Embodiment 2.

Preferably, the organic hole transport material contains an organic compound having at least one selected from constitutional units represented by formulas (1) to (3) and a constitutional unit represented by formula (4). The organic hole transport material containing such an organic compound has excellent capability of injecting holes into, for example, nitride semiconductors typified by GaN. Therefore, the organic hole transport material can enhance the light emitting efficiency when used in combination with the luminescent particles 4 composed of a nitride semiconductor typified by GaN, for example.

[Chemical Formula 1]

(1)

(2)

[Chemical Formula 2]

(3)

(4)

$$-\mathrm{(CH{=}CH)}_n{-}\mathrm{CH{=}C}\begin{smallmatrix}\mathrm{Ph}\\\mathrm{Ph}\end{smallmatrix}$$

[n denotes an integer from 0 to 10 in the formula (4).]

The effect obtained by allowing the organic hole transport material to contain the organic compound having at least one selected from the constitutional units represented by the formulas (1) to (3) and a constitutional unit represented by the formula (4) is that the holes are supplied to the luminescent particles 4 efficiently.

The organic hole transport material may contain at least one selected from organic compounds represented by formulas (5) to (7).

[Chemical formula 3]

(5)

[Chemical formula 4]

(6)

[Chemical formula 5]

(7)

The organic hole transport materials roughly are categorized into low molecular materials and polymer materials. As the low molecular materials having hole transportability, there can be mentioned, for example, diamine derivatives, such as N,N'-bis(3-methylphenyl)-N,N'-diphenylbenzidine (TPD) and N,N'-bis(α-naphthyl)-N,N'-diphenylbenzidine (NPD), that Tang et al. used, particularly, a diamine derivative with Q1-G-Q2 structure disclosed in JP 2037475 B. Q1 and Q2 each denote independently a group having a nitrogen atom and at least three carbon chains (at least one of them is an aromatic group). G denotes a cycloalkylene group, allylene group, alkylene group, or a linking group formed by carbon-carbon bond. The low molecular materials may be multimers (oligomers) containing these structural units. Examples thereof include multimers having a spiro structure or a dendrimer structure. Furthermore, it also is possible to use a material obtained by molecular-dispersing a low-molecular hole transport material in a non-conductive polymer. As a specific example of the molecular-dispersed material, there can be mentioned a material obtained by molecular-dispersing TPD in polycarbonate at high concentration. This material has a hole mobility of approximately $10^{-4}$ $cm^2/Vs$ to $10^{-5}$ $cm^2/Vs$.

In contrast, as the polymer materials having hole transportability, there can be mentioned, for example, a π-conjugated polymer and a σ-conjugated polymer. Examples of these include materials containing an arylamine compound, etc. Specifically, there can be mentioned a poly-para-phenylene vinylene derivative (PPV derivative), a polythiophene derivative (PAT derivative), a polyparaphenylene derivative (PPP derivative), a polyalkylphenylene (PDAF), a polyacetylene derivative (PA derivative), and a polysilane derivative (PS derivative). However, the polymer materials are not limited to these. Furthermore, it is possible to use a polymer obtained by incorporating a molecular structure that is low molecular type and exhibits hole transportability into a molecular chain. Specific examples thereof include polymethacrylamide (PT-PAMMA, PTPDMA) having aromatic amine in its side chain, and polyether (TPDPES, TPDPEK) having aromatic amine in its main chain. As a particularly preferable example among these, poly-N-vinylcarbazole (PVK) exhibits a hole mobility that is extremely high, about $10^{-6}$ $cm^2/Vs$. Other specific examples include PEDOT/PSS and polymethylphenylsilane (PMPS).

Furthermore, a mixture of a plurality of the above-mentioned hole transport materials may be used. Moreover, a crosslinkable material or a polymerizable material that is crosslinked or polymerized under light or heat may be contained.

EXAMPLE 1

An example of the present invention will be described. As the example, a light emitting device as shown in FIG. 4 was produced.

First, a silicon substrate was used as the substrate 1, and arc-shape recesses with a radius of 2 μm and a depth of 1 μm were formed in the silicon substrate by the sandblasting method. In the present example, the radii and depths of the recesses were measured using a profilometer (atomic force microscope (AFM)). The respective recesses formed in the present example had an arc-shape, and the width of the respective recesses in the present example was 4 μm. Subsequently, an Au film was formed, by a resistance heating deposition method, on a surface of the silicon substrate having the recesses. The Au film had a thickness of approximately 300 nm.

As the luminescent particles 4, GaN:Zn particles with a diameter of 4 μm were used. The GaN:Zn particles were produced by mixing 5 g of gallium oxide powder with a diameter of 4 μm with 5 g of zinc oxide powder, putting the mixture on a boat, setting the boat in a quartz tube with an inner diameter of 50 mm, and firing it at 1000° C. for 3 hours with $N_2$ flowing at 100 cc/min and $NH_3$ flowing at 150 cc/min in a tubular furnace.

As the hole transport material 5, there was used an organic hole transport material ("T770" produced by Takasago Chemical Corp.) composed of a mixture of the organic compound represented by the formula (5) and the organic compound represented by the formula (6). The luminescent particles 4 were mixed into this organic hole transport material so that surfaces of the luminescent particles 4 are coated with the organic hole transport material.

Subsequently, the luminescent particles 4 coated with the organic hole transport material were disposed in the recesses of the silicon substrate. On top of this, a glass substrate with an ITO thin film formed thereon was disposed as the transparent electrode 3 so that the ITO thin film was in contact with the luminescent particles 4 coated with the organic hole transport material.

The light emitting device thus produced was measured for brightness. A positive voltage was applied to the back electrode 2 and a negative voltage was applied to the transparent electrode 3, using a direct current power supply as the power supply 6. The brightness measurement was made using a portable luminance meter. As a result, the light emitting device started emitting orange light at a direct current voltage of 5 V, and obtained a brightness of approximately 3500 $cd/m^2$ at 15V.

COMPARATIVE EXAMPLE 1

As a comparative example, a light emitting device was produced under the same conditions as in Example, except for that no recesses were formed in the back electrode 2. A direct current voltage was applied to the light emitting device of the present comparative example to evaluate it. As a result, the light emitting device required a voltage of 30 V or more to emit light, and had a brightness of as low as several tens of candelas per square meter.

(Embodiment 3)

3 Brief Configuration of a Light Emitting Device According to Embodiment 3

Figure 5:
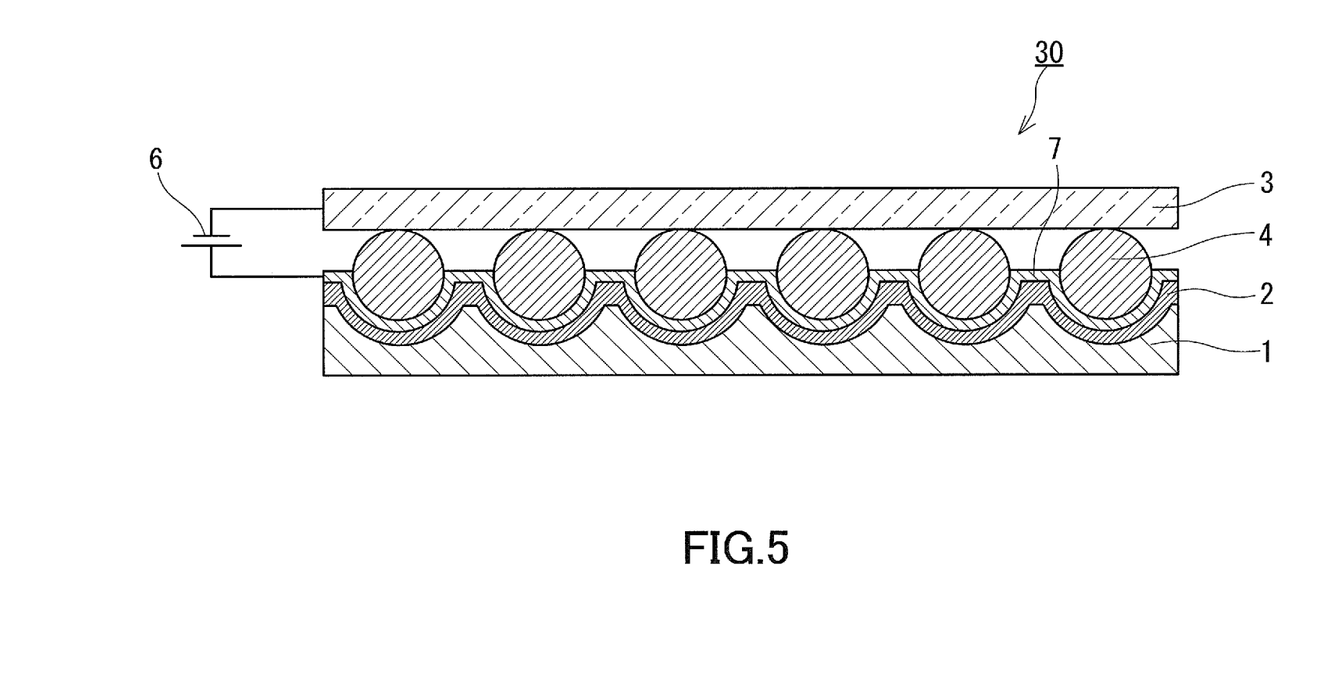
FIG. 5 is a cross-sectional view showing a schematic configuration of a light emitting device according to Embodiment 3.

A light emitting device according to Embodiment 3 of the present invention will be described with reference to FIG. 5. FIG. 5 is a cross-sectional view showing a schematic configuration of a light emitting device 30 according to Embodiment 3. The light emitting device 30 is different from the light emitting device 10 shown in FIG. 1 in that a hole transport layer (carrier transport layer) 7 further is provided on the back electrode 2. Since other configurations are the same as those of Embodiment 1, descriptions thereof are omitted.

The hole transport layer 7 is provided along the surface of the back electrode 2 having the recesses. The thickness of the hole transport layer 7 can be 0.05 μm to 2 μm, for example. Since the thickness of the hole transport layer 7 is substantially uniform, the hole transport layer 7 has substantially the same recesses as those of the back electrode 2. The hole transport layer 7 can be formed by a resistance heating deposition method or the like. The phrase "the thickness of the hole transport layer 7 is substantially uniform" indicates that a difference between a maximum thickness and a minimum thickness of the hole transport layer 7 is 200 nm or less, preferably 5 nm or less.

In the light emitting device 30 according to Embodiment 3, the hole transport layer 7 has the recesses, and the luminescent particles 4 are disposed in these recesses so as to be in contact with the hole transport layer 7. More specifically, the luminescent particles 4 are disposed in such a matter that they are fitted in the recesses of the hole transport layer 7, and at least a part of the respective luminescent particles 4 is in contact with the hole transport layer 7. Many of the holes serving as carriers reach the luminescent particles 4 through a low-resistance path in the hole transport layer 7, that is, the shortest path from the back electrode 2 to the luminescent particles 4. More specifically, use of such a configuration as in Embodiment 3 allows a plurality of the low-resistance paths to exist. This enhances the efficiency in supplying the holes from the back electrode 2 to the luminescent particles via the hole transport layer 7. Accordingly, the efficiency in supplying the holes to the luminescent particles 4 is enhanced, and thus the probability of recombination between the electrons and the holes in the luminescent particles 4 is increased. As a result, the brightness of the luminescent particles 4 is increased.

<Other Embodiments>

The light emitting devices according to Embodiments 1 to 3 of the present invention may be configured as follows.

The substrate 1 may have no recesses. For example, it is possible to form the back electrode 2 on a plate-like substrate and form the recesses by, for example, etching the back electrode 2. The same effects as those of the light emitting devices of Embodiments 1 to 3 can be obtained also in this case.

Moreover, the back electrode 2 may be interchanged with the transparent electrode 3. In this case, the light exits from the substrate 1 side, and thus a substrate having light transparency is used.

An alternating current power supply may be used instead of the direct current power supply.

Furthermore, the back electrode 2 and the transparent electrode 3 may have recesses in surfaces thereof facing each other. Such a configuration makes it possible to supply effectively both the electrons and holes into the luminescent particles 4.

The carrier transport material may be an electron transport material. More specifically, instead of the hole transport material, an electron transport material may be used with luminescent particles to which it is difficult to supply electrons. Any electron transport material can be used as long as it is an organic material having the function of generating and transporting electrons. Specifically, there can be mentioned, for example: various metal complexes typified by metal complexes of tris(8-hydroxyquinolinate)aluminum quinolinol, a triazole derivative, an oxazol derivative, an oxadiazole derivative, a fluorenone derivative, an anthra quinodimethane derivative, an anthrone derivative, a diphenyl quinone derivative, a thiopyran dioxide derivative, a carbodiimide derivative, a fluorenylidene methane derivative, a distyrylpyrazine derivative, heterocyclic tetracarboxylic acid anhydride such as naphthalene perylene, a phthalocyanine derivative, and an 8-quinolinol derivative, and a metal complex containing metal phthalocyanine, benzoxazole, or benzothiazole as a ligand; conductive high molecular oligomers such as an aniline copolymer, thiophene oligomer and polythiophene; and high molecular compounds such as a polythiophene derivative, a polyphenylene derivative, a polyphenylene vinylene derivative, and a polyfluorene derivative.

Moreover, in Embodiment 3, an electron transport material further may be provided between the transparent electrode 3 and the luminescent particles 4. This configuration can be realized by, for example, providing a layer composed of electron transport material onto a surface of the transparent electrode 3 on a luminescent particles 4 side.

The hole transport material may be an inorganic hole transport material. The inorganic hole transport material is not particularly limited as long as it is transparent or translucent, and exhibits p-type conductivity. Preferable examples include: semimetal-based semiconductors such as Si, Ge, SiC, Se, SeTe, and $As_2Se_3$; binary compound semiconductors such as ZnS, ZnSe, CdS, ZnO, and CuI; chalcopyrite semiconductors such as $CuGaS_2$, $CuGaSe_2$, and $CuInSe_2$, and mixed crystals thereof and oxide semiconductors such as $CuAlO_2$ and $CuGaO_2$, and mixed crystals thereof. Furthermore, a dopant may be doped into these materials in order to control conductivity.

Industrial Applicability

The light emitting device of the present invention has high brightness. Therefore, the light emitting device is useful in particular as a light emitting device used in display devices such as television, and various light sources used for communications, lightings, etc.

The invention claimed is:

1. A light emitting device comprising:
 a supporting substrate;
 a back electrode formed on the supporting substrate;
 a transparent electrode provided so as to face the back electrode; and
 luminescent particles provided between the back electrode and the transparent electrode, the luminescent particles being connected electrically to the back electrode and the transparent electrode, wherein the back electrode has recesses in a surface thereof facing the transparent electrode and the back electrode is provided along recesses formed in the supporting substrate, wherein a depth of the respective recesses of the back electrode is smaller than an average particle diameter of the luminescent particles, and wherein when a plane contacting an edge of the respective recesses is defined as a reference plane, and a width of the respective recesses of the back electrode is defined as a maximum dimension of an opening of the respective recesses defined by a contact point between the reference plane and the edge, the width of the respective recesses of the back electrode is larger than the average particle diameter of the luminescent particles.

2. The light emitting device according to claim 1, wherein the luminescent particles are connected electrically to the back electrode at inner surfaces of the recesses.

3. The light emitting device according to claim 1, further comprising a carrier transport material provided between the back electrode and the luminescent particles.

4. The light emitting device according to claim 3, wherein at least a part of a surface of the respective luminescent particles is coated with the carrier transport material.

5. The light emitting device according to claim 4, wherein an entire surface of the respective luminescent particles is coated with the carrier transport material.

6. The light emitting device according to claim 3, wherein the carrier transport material is a carrier transport layer provided along the surface of the back electrode.

7. The light emitting device according to claim 6, wherein the carrier transport layer has a substantially uniform thickness.

8. The light emitting device according to claim 3, wherein the back electrode is an anode, the transparent electrode is a cathode, and the carrier transport layer is formed of an organic hole transport material.

9. The light emitting device according to claim 8, wherein the organic hole transport material contains an organic compound having at least one selected from constitutional units represented by formulas (1) to (3) and a constitutional unit represented by formula (4), (1)

(2)

(3)

(4)

where n denotes an integer from 0 to 10 in the formula (4).

10. The light emitting device according to claim 9, wherein the organic hole transport material contains at least one selected from organic compounds represented by formulas (5) to (7), (5)

-continued (6)

(7)

11. The light emitting device according to claim 1, wherein the back electrode has a substantially uniform thickness.

12. The light emitting device according to claim 1, wherein the luminescent particles are composed of a group 13-15 compound semiconductor.

13. The light emitting device according to claim 12, wherein the luminescent particles are GaN particles.

* * * * *